(12) United States Patent
Sanchez Ribes et al.

(10) Patent No.: US 10,817,473 B2
(45) Date of Patent: Oct. 27, 2020

(54) XML FILE CONDENSING

(71) Applicant: HEWLETT-PACKARD DEVELOPMENT COMPANY, L.P., Houston, TX (US)

(72) Inventors: Salvador Sanchez Ribes, Sabadell (ES); Jorge Castano Aspas, Sant Cugat del Valles (ES)

(*) Notice: Subject to any disclaimer, the term of this patent is extended or adjusted under 35 U.S.C. 154(b) by 0 days.

(21) Appl. No.: 15/765,970

(22) PCT Filed: Nov. 20, 2015

(86) PCT No.: PCT/US2015/061864
§ 371 (c)(1),
(2) Date: Apr. 4, 2018

(87) PCT Pub. No.: WO2017/086989
PCT Pub. Date: May 26, 2017

(65) Prior Publication Data
US 2018/0300352 A1 Oct. 18, 2018

(51) Int. Cl.
*G06F 3/12* (2006.01)
*G06F 16/174* (2019.01)
(Continued)

(52) U.S. Cl.
CPC ........ *G06F 16/1744* (2019.01); *G06F 3/1205* (2013.01); *G06F 3/1219* (2013.01);
(Continued)

(58) Field of Classification Search
CPC ...... G06F 16/1744; G06F 16/81; G06F 16/84; G06F 3/1205; G06F 3/1219;
(Continued)

(56) References Cited

U.S. PATENT DOCUMENTS 6,345,891 B1  2/2002  Childers
6,883,137 B1  4/2005  Girardot
(Continued)

FOREIGN PATENT DOCUMENTS

EP  1610228  12/2005
JP  2005215951  8/2005
(Continued)

OTHER PUBLICATIONS

Support Desk Guide (Research Paper); Dec. 20, 2011; http://www.craden.com/Site/images/training.pdf.
(Continued)

*Primary Examiner* — Iriana Cruz
(74) *Attorney, Agent, or Firm* — Fabian VanCott

(57) ABSTRACT

Examples associated with extensible markup language (XML) file condensing are described. On example includes generating a set of indexes from an XML file. The set of indexes may include a tag index that indexes tag terms used in the XML file, an attribute indexes attribute terms in the XML file, and a value index that indexes value terms in the XML file. The example also includes condensing the XML file into a condensed version of the XML file by translating the XML file according to the indexes. The example also includes generating a translated file. The translated file may be made from the set of indexes and the condensed version of the XML file.

20 Claims, 7 Drawing Sheets

(51) Int. Cl.
  *G06F 16/81* (2019.01)
  *G06F 16/84* (2019.01)
  *H03M 7/30* (2006.01)
  *G06F 40/14* (2020.01)
  *G06F 40/146* (2020.01)
  *G06F 40/154* (2020.01)

(52) U.S. Cl.
  CPC .......... *G06F 3/1246* (2013.01); *G06F 3/1297* (2013.01); *G06F 16/81* (2019.01); *G06F 16/84* (2019.01); *G06F 40/14* (2020.01); *G06F 40/146* (2020.01); *G06F 40/154* (2020.01); *H03M 7/30* (2013.01); *H03M 7/707* (2013.01)

(58) Field of Classification Search
  CPC .. G06F 3/1246; G06F 3/1297; G06F 17/2247; G06F 17/227; H03M 7/30; H03M 7/707
  See application file for complete search history.

(56) References Cited

U.S. PATENT DOCUMENTS

| | | | |
|---|---|---|---|
| 7,375,834 B2 | 5/2008 | Van Der Meijs | |
| 8,161,199 B1 | 4/2012 | Weiser | |
| 8,189,225 B1* | 5/2012 | Lo | G06F 3/122 358/1.15 |
| 8,721,203 B2 | 5/2014 | Ehrhardt, Jr. | |
| 9,183,320 B2 | 11/2015 | Ono et al. | |
| 2003/0016387 A1* | 1/2003 | Takagi | G06F 3/1204 358/1.15 |
| 2003/0023628 A1* | 1/2003 | Girardot | G06F 9/547 715/202 |
| 2004/0199651 A1* | 10/2004 | Kobayashi | G06F 3/1209 709/230 |
| 2005/0278289 A1 | 12/2005 | Gauweiler et al. | |
| 2008/0133557 A1* | 6/2008 | Ishizaki | G06F 16/8373 |
| 2009/0219550 A1* | 9/2009 | Levin | G06F 3/1205 358/1.1 |
| 2012/0254050 A1* | 10/2012 | Scrafford | G06Q 10/00 705/318 |
| 2013/0060740 A1* | 3/2013 | Ono | G06F 16/81 707/693 |
| 2015/0254230 A1* | 9/2015 | Papadopoullos | G06F 17/275 704/8 |

FOREIGN PATENT DOCUMENTS

| | | |
|---|---|---|
| JP | 2006293296 | 10/2006 |
| JP | 2008140179 | 6/2008 |
| JP | 2009518741 | 5/2009 |
| KR | 2015-0099579 | 8/2015 |
| RU | 2304804 | 8/2007 |
| WO | WO-2004010335 | 1/2004 |
| WO | WO-2014106883 | 7/2014 |
| WO | WO-2015016863 | 2/2015 |

OTHER PUBLICATIONS

Przemyslaw Skibinski et al; "Combining Efficient XML Compression with Query Processing"; Serious Games; vol. 4690,pp. 330-342; 2007.

Sakr et al; "XML Compression Techniques: A Survey and Comparison"; Journal of Computer and System Sciences, Academic Press, Inc.; vol. 75, No. 5, pp. 303-322; Aug. 2009.

Uematsu, "Data Compression Algorithm and its Implementation", Interface, Japan, CQ Publishing Co Ltd, Aug. 1, 1992, vol. 18 No. 8, pp. 88-97 (In Japanese).

* cited by examiner

XML FILE CONDENSING

BACKGROUND

Extensible markup language (XML) is used to encode documents in a format readable both by machines and people. Though a document encoded in XML often will not cause a computer to do anything on its own, in combination with an application designed to interpret the XML document, the XML document can cause that application to perform certain functions, display certain information, use certain formatting, and so forth, based on the tags used when encoding the XML document. Consequently, XML standards have been developed to facilitate communication between applications and devices in formats that are agnostic to the specific devices being used. The standards may specify certain keywords or "tags" that will trigger specific functions to be performed. These functions can then be implemented in devices and/or applications in a manner appropriate to that device and/or application.

BRIEF DESCRIPTION OF THE DRAWINGS

The present application may be more fully appreciated in connection with the following detailed description taken in conjunction with the accompanying drawings, in which like reference characters refer to like parts throughout, and in which.

DETAILED DESCRIPTION

Systems, methods, and equivalents associated with extensible markup language (XML) file condensing are described. In various examples it may be desirable to store XML files on devices or items that do not have a large amount of available memory. These items may be designed to be low cost, and therefore it may be impractical to include larger memory storage space without impacting the cost of producing these items. For example, print containers (e.g., ink cartridges) are a mass market item and pricing of the containers may be competitive, and therefore employing memory resources with excessive space may be wasteful and unnecessarily expensive.

Consequently, an XML file stored on a print container may be condensed in a manner that facilitates reducing the memory impact of the XML file. Though it may take some time for a printer to decondense the file when the print container is installed in the printer, this processing time may be negligible considering that much of the time involved with printing revolves around moving mechanical components of the printer. Though examples involving print containers are described, the techniques described herein may be usable in other fields and/or applications.

Consequently, a manner of condensing an XML file for storing these XML files is disclosed, Ultimately, the XML file may be stored as a set of indexes and a condensed version of the XML file. The indexes may be created by dividing the text of the XML file into three types of indexes: tags, attributes, and values. The XML file may then be translated according to the indexes. The indexes and the condensed XML file may then be stored in, for example, a print container. When the print container is inserted into a printer, the printer may decondense the condensed XML file into the original XML file using the indexes, allowing the printer to use the XML file to perform actions described in the XML file.

Figure 1:
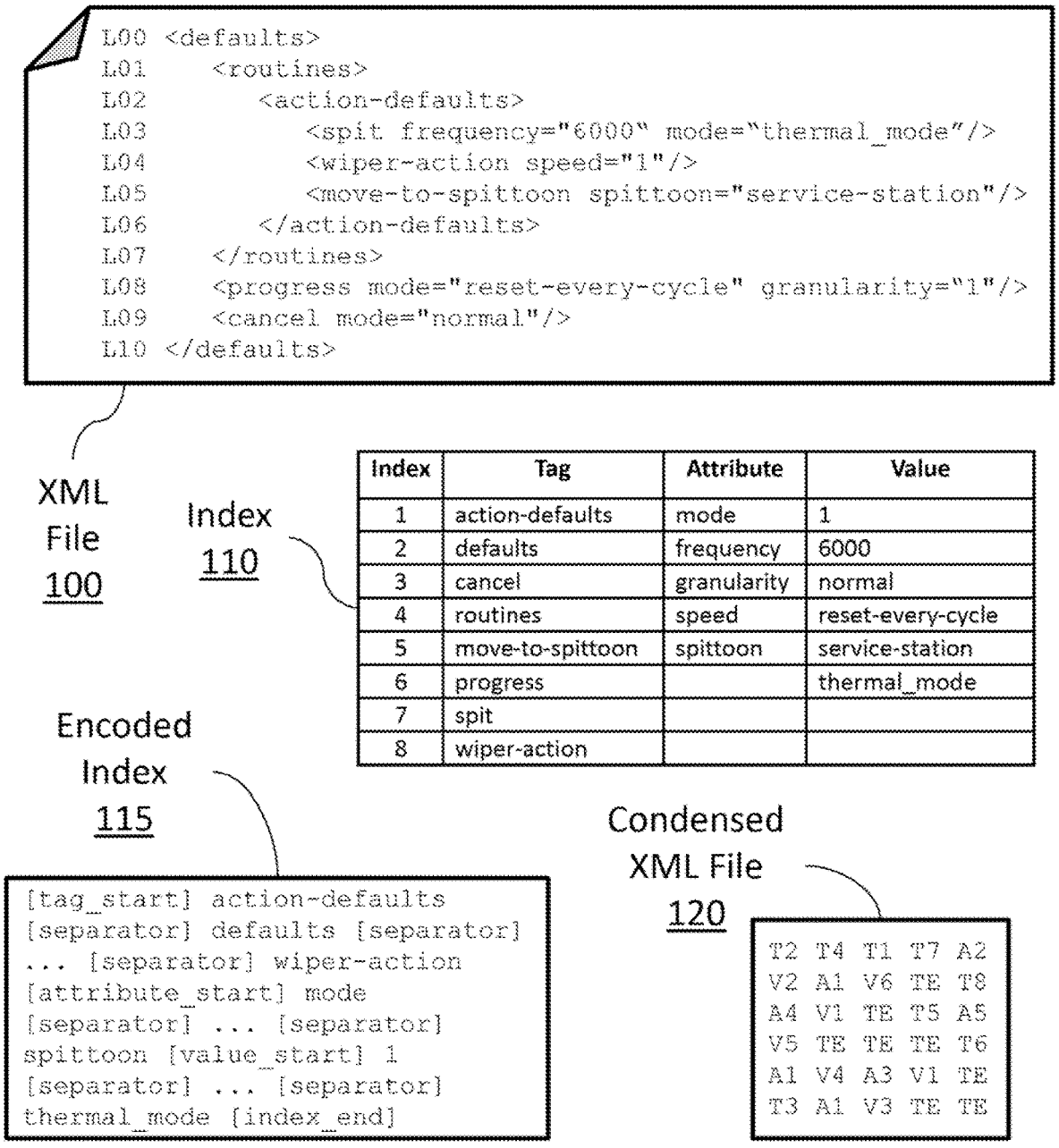
FIG. 1 illustrates example files and data structures associated with XML file condensing.

FIG. 1 illustrates example files and data structures associated with XML file condensing. It should be appreciated that the items depicted in FIG. 1 are illustrative examples and many different files, data structures, techniques for condensing an XML file, and so forth may operate in accordance with various examples. FIG. 1 illustrates an XML file 100. XML file 100 is illustrated as having eleven lines labeled L00 through L10. XML file 100 illustrated here is made up of three element types: tags, attributes, and values.

As used herein, tags generally refer to instructions that define an action to be performed. In XML file 100, for example, "<defaults>", "<spit . . . />" and "<routines>" are examples of tags. Tags may include other nested tags. Two tag syntaxes are illustrated in XML file 100. The "<defaults>" tag opens on L00 and ends on L10 with a closing tag "</defaults>", while the "<spit . . . />" tag begins and ends on the same line. In this example, each tag is illustrated on a different line for illustrative purposes, though multiple tags could be written on the same line.

Tags may also include attributes. In XML file 100, "mode", "frequency", and "granularity" are examples of attributes. As used herein, an attribute of a tag may be used to specify a parameter of the unique action triggered by that tag. Further, the attributes may be assigned values. In XML file 100, "1", "normal" and "thermal_mode" are examples of values. As used herein, values may be used in association with attributes to specify the parameter of the unique action triggered by a tag the attribute is modifying. By way of illustration, the "<wiper-action . . . />" tag has a "speed" attribute that is set to the value "1". Using the "speed" attribute with the "<wiper-action . . . />" tag in this way may cause the action associated with the "<wiper-action . . . />" tag to behave in a certain way. For example, the "<wiper-action . . . />" tag may cause wipers associated with a printer to turn on, and the "speed" attribute may be used to define the speed at which the wipers will operate, which in this case is "1".

To facilitate certain condensation and compression techniques described above, it may be desirable for XML file 100 to have a specific known set of syntaxes. This set of syntaxes may be a subset of possible XML syntaxes. For example, though XML might support values having space characters in them, it may be desirable to ensure that values in XML file 100 use underscores or dashes instead of space characters (e.g., the "thermal_mode" value in line L03, "action-defaults" in line L02). Using a subset of syntaxes may make it easier and/or more, efficient to condense, compress, decompress, and decondense XML file 100 by making it easier to ensure that there is not collision due to two phrases having two different syntaxes compressing to the same compressed phrase.

As discussed above, it may be desirable to store XML file 100 in a condensed format. Though XML file 100 as illustrated may be short enough that condensation would be unwarranted, for longer XML files that contain more thorough instructions with more repetition of tags, attributes, and values, condensation may be desirable. To condense XML file 100, first an index 110 may be created. This may be achieved by identifying the tags, attributes, and values in XML file 100 and separating them into their separate categories. Here, XML file 100 includes 8 tags, 5 attributes, and 6 values. In various examples, it may be desirable to further sort the tags attributes and values to assist in condensation and/or a later compression pass of XML file 100. Here, tags, attributes and values are sorted first by their term frequency, and then alphabetically. For example, the "mode" attribute appears in lines L03, and L09, while the "frequency" attribute appears only in line L03. Similarly, tag "<defaults>" appears in lines L00 and L10, while tag "<progress . . . />" appears only in line L08.

Though one method of indexing the tags, attributes, and values is shown, others may be used instead. By way of illustration, in index 110, the tags, attributes, and values all use the same range of index numbers 1-8. In other examples, indexes may be designed instead where the tags, attributes, and values are each assigned non-overlapping index ranges. Other index assignments may also be appropriate.

Once index 110 has been created, encoding of the index into encoded index 115 and condensation of XML file 100 into condensed XML file 120 may begin. In FIG. 1, one possible version of encoded index 115 is shown. Bracketed items may represent specialized identifiers in encoded index 115 that are used to indicate separation between components of index 110. In one example, the separators may be, for example, characters such as spaces, punctuation, a combination, known values, and so forth. In example encoded index 115, 5 separators are used: "[tag start]" which indicates a beginning of the tag index, "[attribute_start]" which indicates the beginning of the attribute index, "[value_start]" which indicates the beginning of the value index, "[separator]" which indicates separation between components of index 110, and "[index_end]" which indicates the end of encoded index 115. In cases where encoded index 115 and condensed XML file 120 are stored as a single item, the "[index_end]" separator may also indicate the beginning of condensed XML file 120. Further, some of the separators may be represented by the same specialized identifiers.

As discussed above, in the example index 110 illustrated, tags, attributes, and values each use the same index range, and that index range begins from a known value. Consequently, encoded index 115 may not need to identify index values of the tags, attributes, and keys within encoded index 115. Instead, this information may be reconstructed as a part of a process of decondensing condensed XML file 120. In example implementations where tags, attributes, and values are assigned varying indexes, this information may also be stored in encoded index 115.

To create condensed XML file 120, XML file 100 may be translated according to index 110. Here, XML file 100 has been translated so that each pair of characters (e.g., "T2") in condensed XML file 120 corresponds to a specific tag, attribute, or value of XML file 100. This correspondence can be seen by examining index 110. Specifically, the first "<defaults>" tag is identified as having index 2 in index 110. Thus, the first T2 of condensed XML file 120 corresponds to the first "<defaults>" tag in XML file 100 because it is tag (indicated by the T) number 2 in index 110. Similarly, the phrase "<spit frequency="6000" mode="thermal_mode"/>" from line L03 of XML file 100 corresponds to the portion of condensed XML file 120 that reads "T7 A2 V2 A1 V6 TE" that spans the first and second lines of condensed XML file 120. It is worth noting that condensed XML file 120 and encoded index 115 may have more or fewer characters depending on how these items are created, including additional symbols that could serve a variety of purposes.

In this example version of condensed XML file 120, a specialized symbol indicating a tag end is used. This symbol, represented as "TE", is used to indicate to an application interpreting condensed XML file 120, that the most recent open tag here should be closed. By way of illustration, the very last "TE" in condensed XML file 120 corresponds to the close of the "</defaults>" tag on line L10 of XML file 100. In various examples, using the TE tag may be desirable because certain forms of compression are more efficient the more that characters repeat. This is also a reason why sorting the tag index by term frequency is useful, as increased usage of the same indexes can further increase compression efficiency.

Consequently, once XML file 100 has been condensed into encoded index 115 and condensed XML file 120, the combination of which will be referred to as a translated file, the translated file may be further reduced in size by employing a compression technique. Which compression technique is used may depend on how encoded index 115 and condensed xml file 120 are created as the creation of these items may be designed to be optimal for a specific data compression technique.

Whether the translated file has been further compressed or not, the translated file may then be stored on a memory of an item with which XML file 100 is associated. One example item where this type of condensation of XML file 100 may be desirable is a print container containing a supply of print material. The print material and/or the print container may be designed to work with a specific type of printer. The printer may be two dimensional printers ranging such as a desktop printer designed for home or office use, an industrial scale printers that can output thousands of items per hour, and so forth. The printer could also be a three-dimensional printer. As mentioned above, these techniques involving condensing XML files may also be applied outside of the printing field.

Depending on the type of printer with which the print container is associated with, the print material may include ink, toner, cleaning fluid, build material for a 3D printer, and so forth. Thus, in this example, XML file 100 may contain instructions for the printer into which the print container is installed. These instructions may tell the printer how to operate efficiently using the print material. Consequently, these instructions may be related to cleaning the printer, otherwise servicing the printer, printing using the print material, and so forth. Other information could be conveyed to the printer in this manner, (e.g., security information, general updates).

Once the print container is installed into a printer, that printer may retrieve the translated file from the memory of the print container, and then begin decompressing, and decondensing the translated file back into XML file 100. How the file is decompressed will depend on the compression technique used. Decondensing the translated file may operate in reverse of creating the condensed XML file. Because syntaxes may be limited to a known set of syntaxes, XML file 100 may be recreated by filling in the syntaxes based on the specific ordering of tags, attributes, and values in condensed XML file 120. After decondensing the translated file back into XML file 100, the printer may then use the instructions to perform a function described by XML file 100 (e.g., cleaning the printer, servicing the printer, printing using a material in the print container).

In some examples, after decompressing and decondensing the translated file back into XML file 100, the printer may combine the instructions from XML file 100 with a set of stored instructions. These stored instructions may be a set of default instructions that the printer may use regardless of which print material is installed, unless overwritten by an instruction from an XML file such as XML file 100.

It is appreciated that, in the following description, numerous specific details are set forth to provide a thorough understanding of the examples. However, it is appreciated that the examples may be practiced without limitation to these specific details. In other instances, methods and structures may not be described in detail to avoid unnecessarily obscuring the description of the examples. Also, the examples may be used in combination with each other.

"Module", as used herein, includes but is not limited to hardware, firmware, software stored on a computer-readable medium or in execution on a machine, and/or combinations of each to perform a function(s) or an action(s), and/or to cause a function or action from another module, method, and/or system. A module may include a software controlled microprocessor, a discrete module, an analog circuit, a digital circuit, a programmed module device, a memory device containing instructions, and so on. Modules may include gates, combinations of gates, or other circuit components. Where multiple logical modules are described, it may be possible to incorporate the multiple logical modules into one physical module. Similarly, where a single logical module is described, it may be possible to distribute that single logical module between multiple physical modules.

Figure 2:
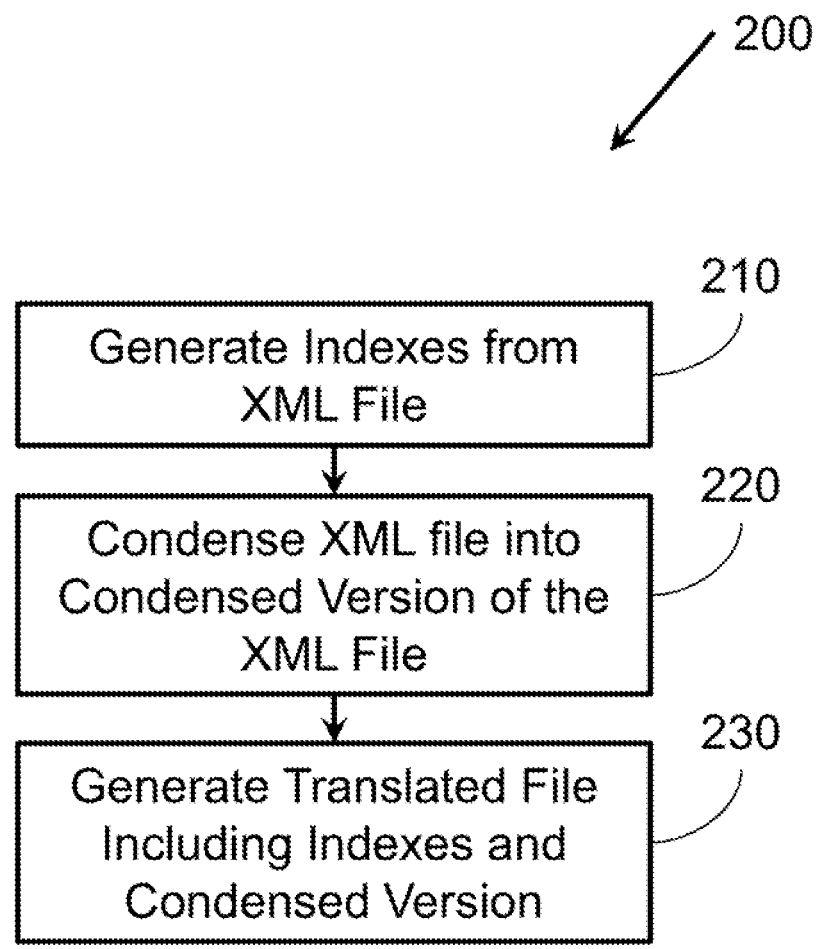
FIG. 2 illustrates a flowchart of example operations associated with XML file condensing.

FIG. 2 illustrates an example method 200 associated with XML file condensing. Method 200 may be embodied on a non-transitory computer-readable medium storing processor-executable instructions. The instructions, when executed by a processor, may cause the processor to perform method 200. In other examples, method 200 may exist within logic gates and/or RAM of an application specific integrated circuit.

Method 200 includes generating indexes from an extensible markup language (XML) file at 210. In various examples, the XML file may contain instructions that control operation of a printer. The XML file may contain instructions that control operation of the printer based on a type of printing material stored in a printing material container (e.g., ink cartridge). By way of illustration, different materials may affect components of a printer in different manners and may cause those components to have different maintenance needs. Thus, an XML file associated with a print container storing a particular print material may be able to control the printer to perform various functions, including maintenance functions, suitable for the particular print material. The XML file may also include other instructions related to, for example, cleaning the printer, servicing the printer, printing using the printing material, and so forth.

The set of indexes may include several indexes including a tag index, an attribute index, and a value index. The tag index may index tag terms used in the XML file. The attribute index may index attribute terms in the XML file. The value index may index value terms in the XML file. In some examples, the terms in the tag index, attribute index, and value index may be ordered within their respective indexes according to the frequency of the terms within the XML file. Ordering the indexes according to term frequencies may be desirable because certain compression techniques achieve greater compression rates the more terms are repeated. Consequently, when index ranges overlap, the repeated use of these indexes may help achieve greater compression rates.

In various examples, the XML file may contain instructions that control operation of a printer. The XML file may contain instructions that control operation of the printer based on a type of printing material stored in a printing material container (e.g., ink cartridge). By way of illustration, different materials may affect components of a printer in different manners and may cause those components to have different maintenance needs. Thus, an XML file associated with a print container storing a particular print material may be able to control the printer to perform various functions, including maintenance functions, suitable for the particular print material. The XML file may also include other instructions related to, for example, cleaning the printer, servicing the printer, printing using the printing material, and so forth.

Method 200 also includes condensing the XML file into a condensed version of the XML file at 220. The condensed version of the XML file may be condensed by translating the XML file according to the indexes. In some examples, to facilitate creation of the indexes at 210, condensation of the XML file at 220, and the potential decondensation of the XML file at a later point, the XML file may use a known subset of XML syntaxes. These syntaxes may be preselected so that, for example, for any two given different XML statements, the condensed version of these two statements be different. Similarly, the syntaxes may also be selected so that for any two given different condensed statements, decondensed versions of these statements will also be different.

Method 200 also includes generating a translated file 230. The translated file may be made up of the set of indexes created at action 210, and the condensed version of the XML file created at action 220. By way of illustration, the indexes and the condensed version of the XML file may be concatenated into a single file to create the translated file.

Figure 3:
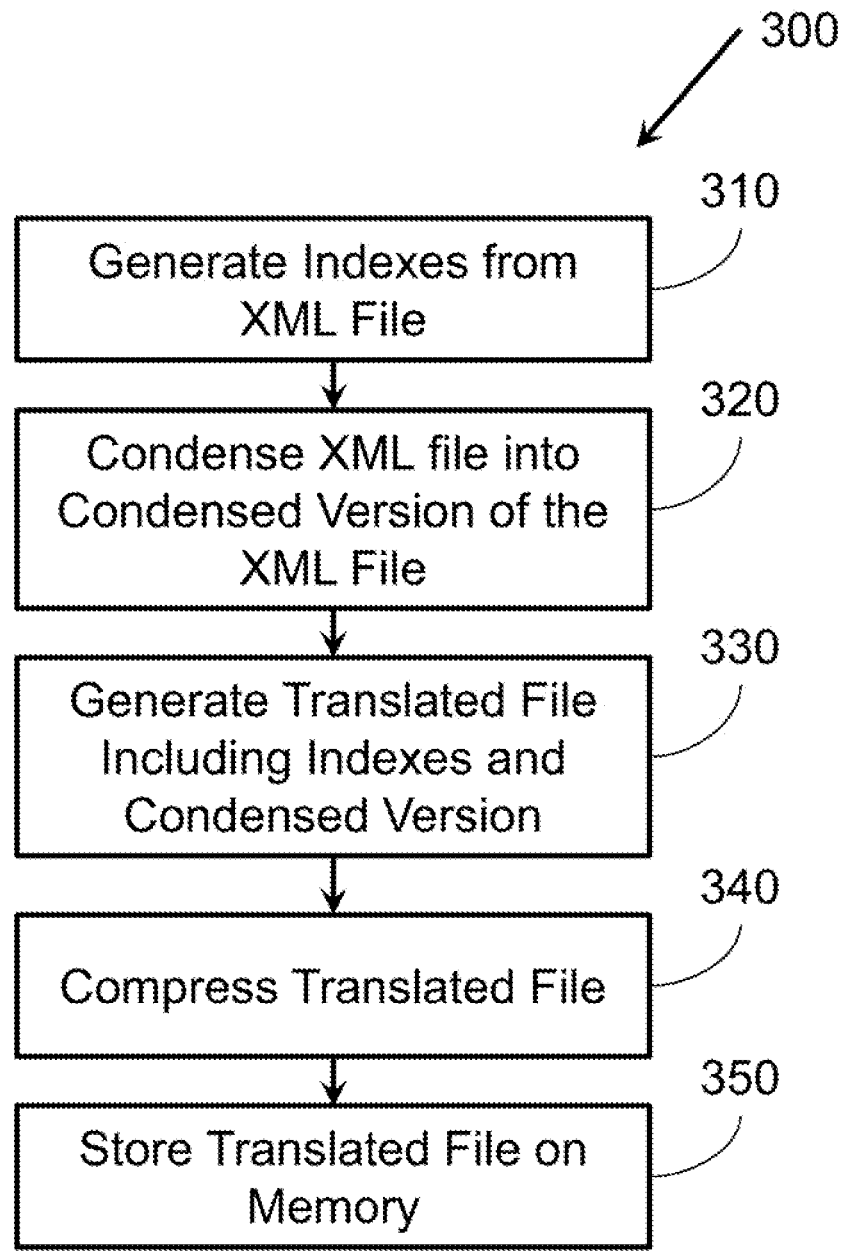
FIG. 3 illustrates another flowchart of example operations associated with XML file condensing.

FIG. 3 illustrates a method 300 associated with XML file condensing. Method 300 includes several actions similar to those described above with reference to method 200 (FIG. 2). For example, method 300 includes generating a set of indexes from an XML file at 310, condensing the XML file into a condensed version of the XML file at 320, and generating a translated file including the set of indexes and the condensed version of the XML file at 330.

Method 300 also includes compressing the translated file at 340. Compressing the translated file may further reduce the total file size of the translated file. Method 300 also includes storing the translated file on a memory at 350. In an example where the XML file contains instructions that control operation of a printer in association with a printing material, the translated file may be stored on a memory of a printing material container that holds a supply of printing material. This may allow a printer to be specifically configured for using a variety of printing materials without having to store this information in the printer itself. This may be desirable when, for example, configuring the printer to use a new printing material, saving memory space within the printer, and so forth.

Figure 4:
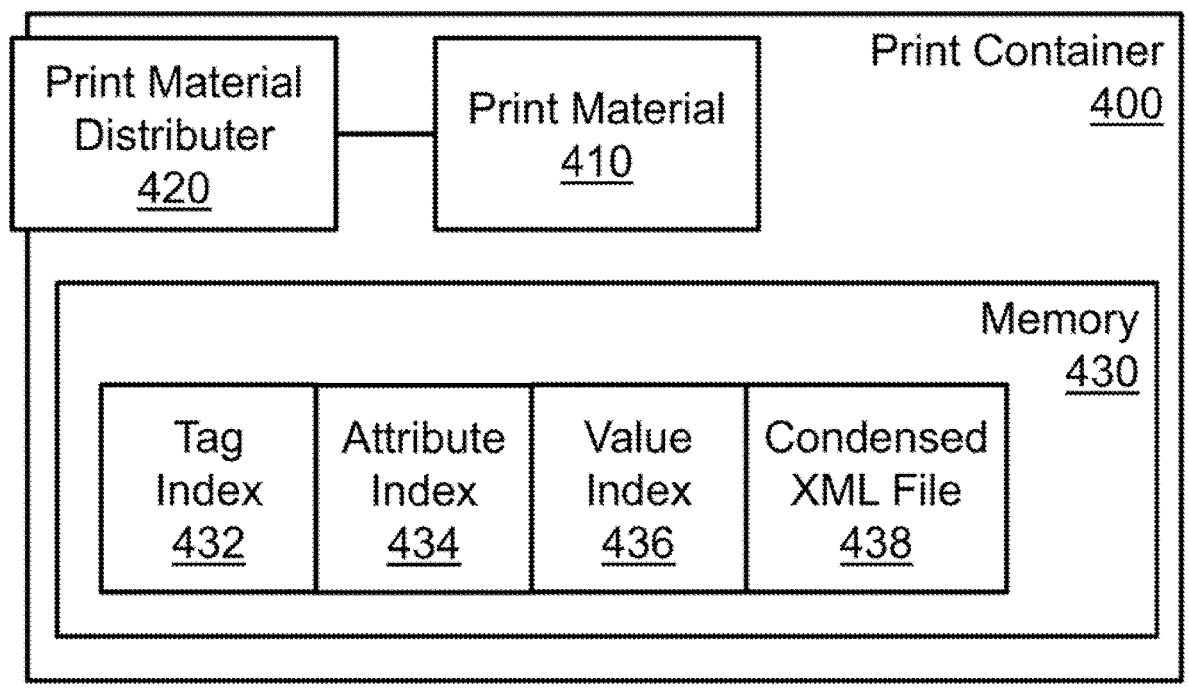
FIG. 4 illustrates an example print container associated with XML file condensing.

FIG. 4 illustrates a print container 400 associated with extensible markup language (XML) file condensing. Print container 410 includes a supply of print material 410. Print material 410 may be, for example, ink, cleaning fluid, and so forth. Print container 400 also includes a print material distributer 420. Print material distributer 420 may take many forms depending on how a printer into which print container 400 is inserted is designed to operate. For example, if the printer draws print material 410 from print container 400 to be ejected onto a print media at another location, print material distributer 420 may interface with a mechanism of the printer that draws the print material 410 from print container 400. Alternatively, if print container is a cartridge designed to directly eject print material 410 onto a print media, print material distributer 420 may directly distribute print material 410.

Print container also includes a memory 430. Memory 430 includes a tag index 432. Tag index 432 may contain a list of tag terms from an extensible markup language (XML) file. The tag terms may be organized according to the frequency of the tag terms in the XML file. Memory 430 also includes an attribute index 434. Attribute index 434 may contain a list of attribute terms from the XML file. The attribute terms may be organized in attribute index 434 according to the frequency of the attribute terms in the XML file. Memory 430 also includes a value index 436. Value index 436 may contain a list of value terms from the XML file. The value terms may be organized in value index 436 according to the frequency of the value terms in the XML file.

Memory 430 also includes a condensed XML file 438. Condensed version of the XML file 438 may be created by translating the XML file according to the tag index, the attribute index and the value index. In some examples, tag index 432, attribute index 434, value index 436, and condensed XML file 438 may be stored in memory 430 in a compressed format. In various examples, a printer into which print container 400 is inserted may use the tag index, the attribute index, the value index, and the condensed version of the XML file to recreate the XML file. Consequently, the recreated XML file may control an operation of the printer in association with one or more of, print material 410, print container 400, print material distributer 420, and so forth.

Figure 5:
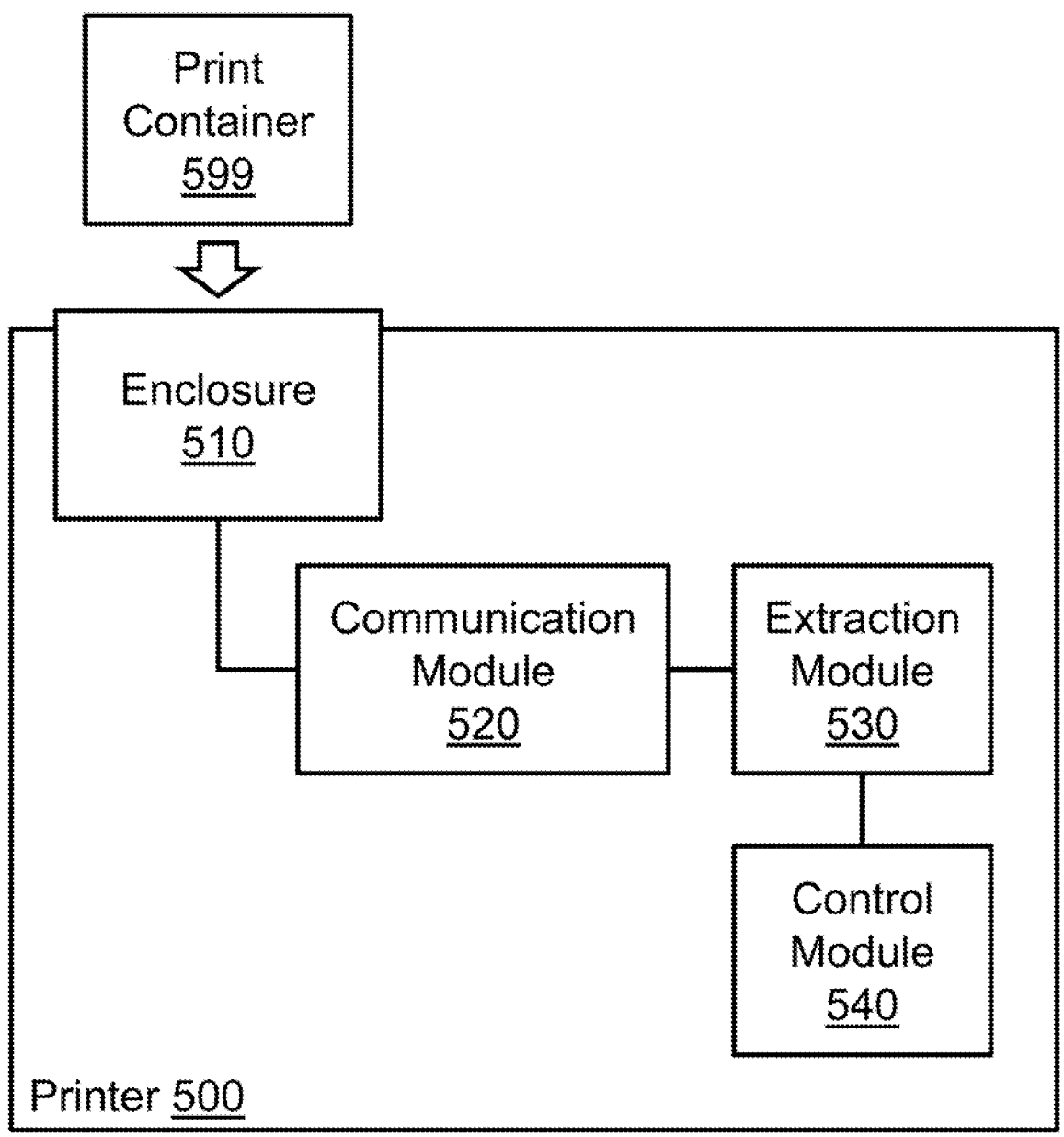
FIG. 5 illustrates an example printer associated with XML file condensing.

FIG. 5 illustrates a printer 500 associated with extensible markup language (XML) file condensing. Printer 500 includes an enclosure 510. Enclosure 510 may receive a print container 599 having a supply of print material. The print material may be, for example, ink, toner, cleaning fluid, and so forth.

Printer 500 also includes a communication module 520. Communication module 520 may obtain a set of indexes and a condensed XML file from print container 599. The condensed XML file may have been created from the set of indexes as well as an original XML file that is not stored on print container 599. In various examples, communication module 520 may retrieve the set of indexes and condensed XML file from a memory on print container 599. Consequently, in this example, enclosure 510 and print container 599 may contain appropriate electronic couplings to facilitate communication between communication module 520 and the memory on print container 599.

Printer 500 also includes an extraction module 530. Extraction module 530 may generate a decondensed XML file. The decondensed XML file may be generated by translating the condensed XML file according to the set of indexes.

Printer 500 also includes a control module 540. Control module 540 may control an operation of printer 500 according to instructions retrieved from the decondensed XML file. In various examples, control module 540 may control one or more of, cleaning a component of the printer, servicing a component of the printer, printing using the print material contained in print container 599, and so forth.

Figure 6:
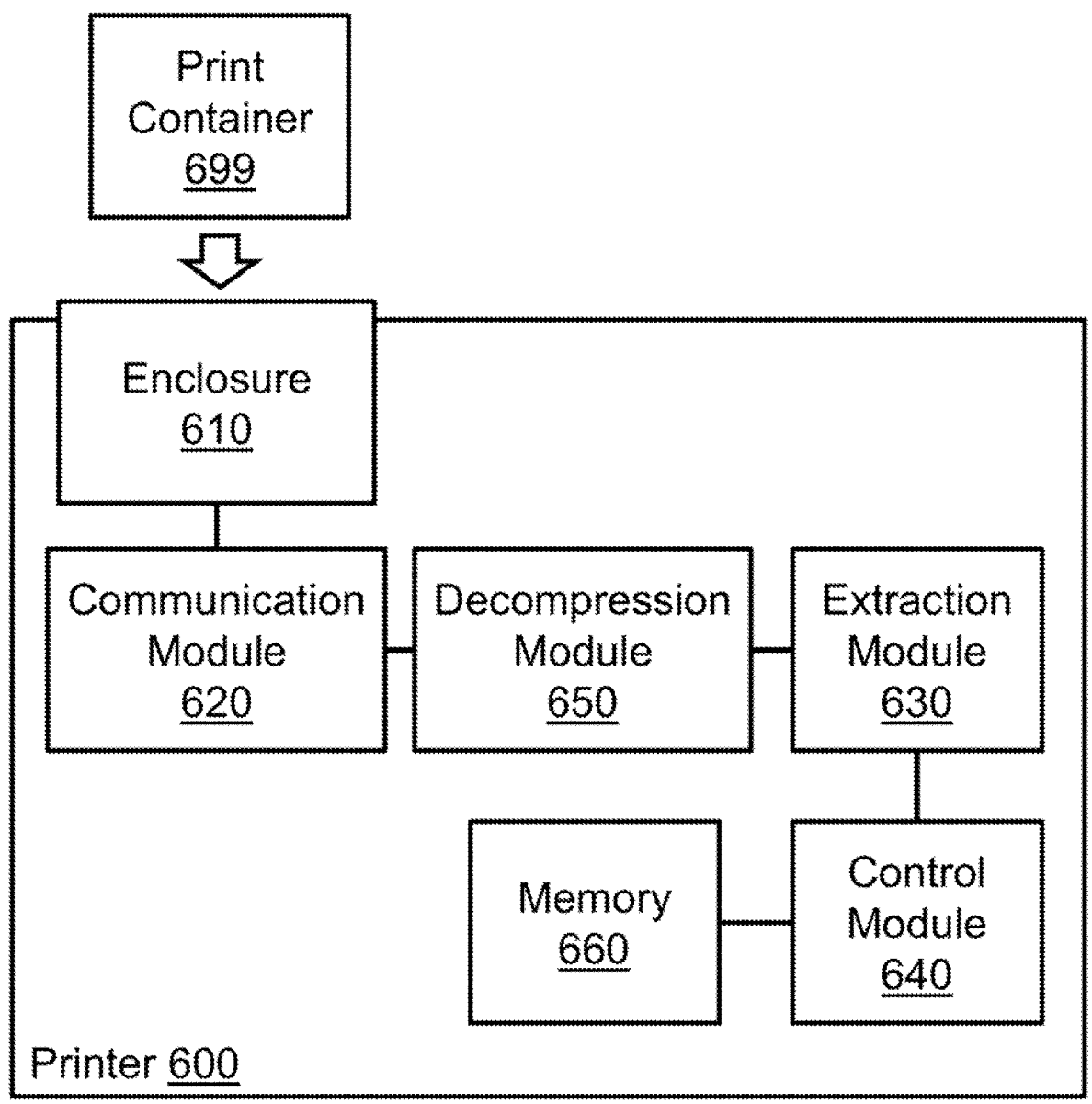
FIG. 6 illustrates another example printer associated with XML file condensing.

FIG. 6 illustrates a printer 600 associated with XML file condensing. Printer 600 includes several items similar to those described above with reference to printer 500. For example, printer 600 includes an enclosure 610 to receive a print container 699 having a supply of print material, a communication module 620, an extraction module 630 and a control module 640.

Printer 600 also includes a decompression module 650. Decompression module 650 may decompress the set of indexes and the condensed XML file. Decompression of the condensed XML file and the indexes may be performed when these items are stored on a memory of print container 699 in a compressed format to further reduce the amount of data stored on print container 699.

Printer 600 also includes a memory 660. Memory 660 may store a set of default instructions. Consequently, control module 640 may control the operation of the printer according to instructions retrieved from the decondensed XML file when the decondensed XML file modifies the default instructions. As discussed above, the operation of the printer may relate to cleaning the printer, servicing the printer, printing using the print material, and so forth.

Figure 7:
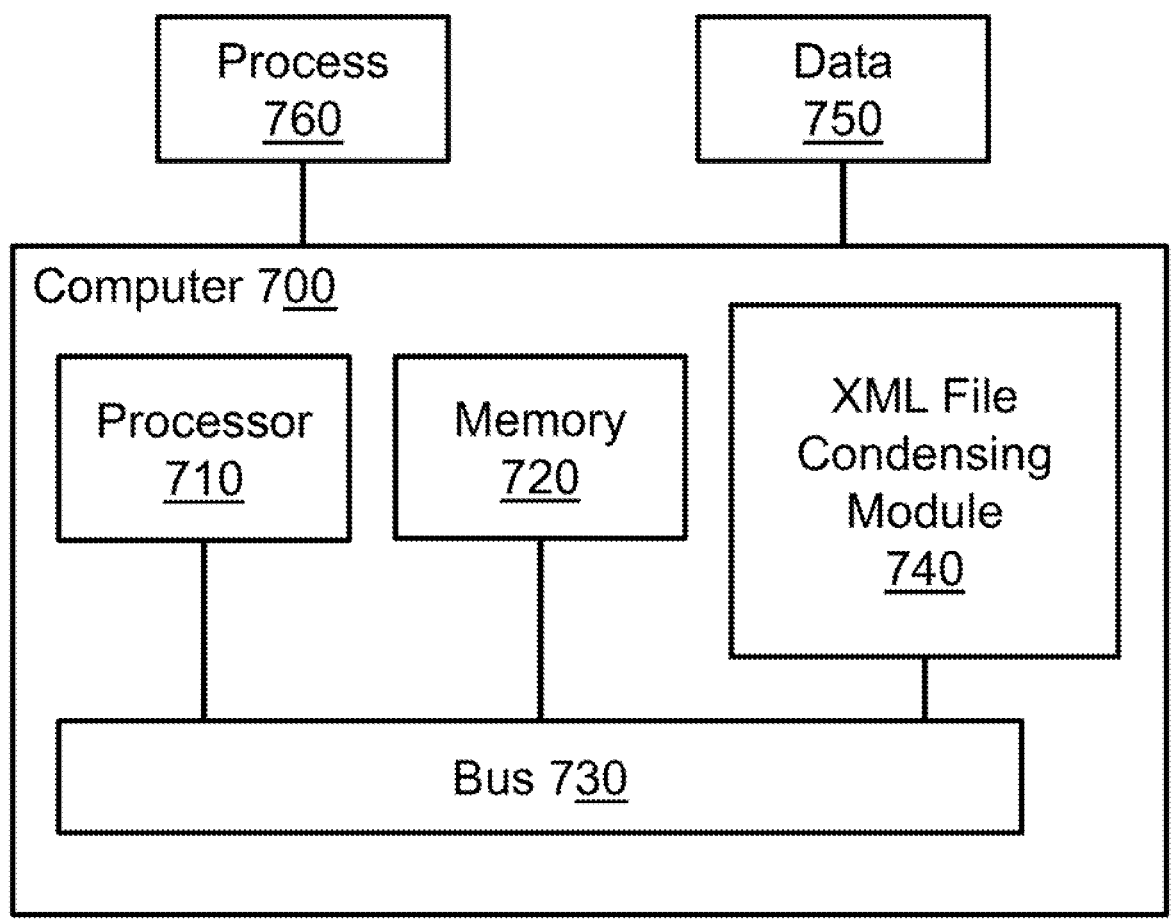
FIG. 7 illustrates an example printer in which example systems, and methods, and equivalents, may operate.

FIG. 7 illustrates an example computer in which example systems and methods, and equivalents, may operate. The example computer may include components such as a processor 710 and a memory 720 connected by a bus 730. Computer 700 also includes an XML file condensing module 740. XML file condensing module 740 may perform, alone or in combination, various functions described above with reference to the example systems, methods, apparatuses, and so forth. In different examples, XML file condensing module 740 may be implemented as a non-transitory computer-readable medium storing processor-executable instructions, in hardware, software, firmware, an application specific integrated circuit, and/or combinations thereof.

The instructions may also be presented to computer 700 as data 750 and/or process 760 that are temporarily stored in memory 720 and then executed by processor 710. The processor 710 may be a variety of processors including dual microprocessor and other multi-processor architectures. Memory 720 may include non-volatile memory (e.g., read only memory) and/or volatile memory (e.g., random access memory). Memory 720 may also be, for example, a magnetic disk drive, a solid state disk drive, a floppy disk drive, a tape drive, a flash memory card, an optical disk, and so on. Thus, memory 720 may store process 760 and/or data 750. Computer 700 may also be associated with other devices including computers, printers, peripherals, and so forth in numerous configurations (not shown).

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:
1. A method, comprising:
   generating a set of indexes from an extensible markup language (XML) file, where the set of indexes includes a tag index that indexes tag terms used in the XML file to provide a tag index reference corresponding to each tag term, an attribute index that indexes attribute terms in the XML file to provide an attribute index reference corresponding to each attribute term, and a value index that indexes value terms in the XML file to provide a value index reference corresponding to each value term;

condensing the XML file into a condensed version of the XML file according to the indexes, including replacing each tag term with a corresponding reference to the tag index, each attribute term with a corresponding reference to the attribute index and each value term with a corresponding reference to the value index; and generating a translated file comprising the set of indexes and the condensed version of the XML file.

2. The method of claim 1, where the XML file contains instructions that control operation of a printer based on a type of printing material stored in a printing material container.

3. The method of claim 2, comprising:
storing the translated file on a memory associated with the printing material container.

4. The method of claim 1, comprising: compressing the translated file.

5. The method of claim 2, where the instructions that control operation of a printer control one or more of cleaning the printer, servicing the printer, and printing using the printing material.

6. The method of claim 1, where the XML file uses a known subset of XML syntaxes.

7. The method of claim 1, where tag terms, attribute terms, and value terms are ordered in their respective indexes according to term frequencies of terms in the XML file.

8. The method of claim 1, wherein each index is sorted first by term frequency in the XML file and then alphabetically.

9. The method of claim 1, further comprising using a specialized symbol in the condensed XML file to represent a tag end.

10. A print container, comprising:
a supply of a print material;
a print material distributer; and
a memory storing:
  a tag index containing a list of tag terms from an extensible markup language (XML) file organized according to a frequency of the tag terms in the XML file;
  an attribute index containing a list of attribute terms from the XML file organized according to a frequency of the attribute terms in the XML file;
  a value index containing a list of value terms from the XML file organized according to a frequency of the value terms in the XML file; and
  a condensed version of the XML file created by translating the XML file according to the tag index, the attribute index, and the value index.

11. The print container of claim 10, where a printer into which the print container is installed uses the tag index, the attribute index, the value index, and the condensed version of the XML file to recreate the XML file.

12. The print container of claim 11, where the recreated XML file controls an operation of the printer in association with at least one of the print material, the print material distributer, and the print container.

13. The print container of claim 10, where the tag index, the attribute index, the value index, and the condensed version of the XML file are stored in the memory in a compressed format.

14. The print container of claim 10, wherein, in the memory, the three indexes and the condensed version of the XML file are concatenated into a single file.

15. The print container of claim 10, wherein the condensed version of the XML file includes a specialized symbol to represent a tag end.

16. A circuit for a print container that is to be used in a printer, the circuit comprising:
a memory, the memory comprising a set of indexes and a condensed extensible markup language (XML) file created from the indexes;
wherein the condensed XML file comprises an index reference for each term in an original XML file from which the condensed XML file was generated,
each index reference comprising a first reference to a particular index in the set of indexes and a second reference to a specific entry in the particular index,
the set of indexes comprising a tag index for tag terms from the original XML file, an attribute index for attribute terms from the original XML file and a value index for value terms from the original XML file.

17. The circuit of claim 16, wherein each index is sorted first by term frequency in the XML file and then alphabetically.

18. The circuit of claim 16, further comprising using a specialized symbol in the condensed XML file to represent a tag end.

19. The circuit of claim 16, wherein, in the memory, the three indexes and the condensed version of the XML file are concatenated into a single file.

20. The circuit of claim 16, further comprising an interface for communication with a printer in which a print container bearing the circuit is deployed.

* * * * *